(12) United States Patent
O'Riordan

(10) Patent No.: US 9,245,088 B1
(45) Date of Patent: Jan. 26, 2016

(54) SYSTEM AND METHOD FOR DATA MINING SAFE OPERATING AREA VIOLATIONS

(71) Applicant: Cadence Design Systems, Inc., San Jose, CA (US)

(72) Inventor: Donald J. O'Riordan, Sunnyvale, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 14/500,735

(22) Filed: Sep. 29, 2014

(51) Int. Cl.
*G06F 17/50* (2006.01)

(52) U.S. Cl.
CPC ........ *G06F 17/5081* (2013.01); *G06F 17/5022* (2013.01); *G06F 17/5036* (2013.01)

(58) Field of Classification Search
CPC ............ G06F 17/5081; G06F 17/5022; G06F 17/5036
See application file for complete search history.

(56) References Cited

U.S. PATENT DOCUMENTS

| | | | |
|---|---|---|---|
| 6,591,402 B1 * | 7/2003 | Chandra et al. | 716/106 |
| 6,735,765 B1 * | 5/2004 | Schumacher | 717/164 |
| 7,039,645 B1 * | 5/2006 | Neal et al. | |
| 7,574,652 B2 * | 8/2009 | Lennon et al. | 715/248 |
| 8,145,458 B1 * | 3/2012 | Kukal et al. | 703/4 |
| 8,543,379 B1 * | 9/2013 | Michelsen | 704/9 |
| 8,676,720 B1 * | 3/2014 | Neal et al. | 705/343 |
| 9,032,347 B1 * | 5/2015 | O'Riordan | 716/107 |
| 2003/0104470 A1 * | 6/2003 | Fors et al. | 435/7.1 |
| 2005/0149893 A1 * | 7/2005 | Roesner et al. | 716/4 |

* cited by examiner

*Primary Examiner* — Naum B Levin
(74) *Attorney, Agent, or Firm* — Kenyon & Kenyon LLP

(57) ABSTRACT

A system and method for managing SOA assertion violations and related simulator output. Embodiments transform simulator output into descriptive data regarding SOA violations for relational database storage and processing. The database executes queries on the descriptive data according to user input specifying particular descriptive data and SOA assertion violations of interest, and outputs query results for further user action. Individual and accumulative SOA violations are more easily explored by users, through a search language that facilitates selection rule specification via pre-existing or user-defined filters. Filters may inherit rules and combine them with logical and comparative operators, enabling easy construction of complex selection expressions to provide more intuitive design guidance.

20 Claims, 8 Drawing Sheets

FIG. 5

```
<?xml version="1.0" encoding="UTF-8" standalone="yes"?>

<filters>

<filter> name="MOV" synopsis="MOV in message"
help='When applied using the database mining script (described later), the "MOV" filter will
filter the violations to only those that contain the term "MOV" as a substring within the
Message field of the violation'>Message contains "MOV"</filter>

<filter name="MOV_MOS_XYZ" synopsis="MOV violations for MOS_XYZ devices "
help="A filter that matches MOV somewhere.">Message contains "MOV" and Message contains
"MOS_XYZ"</filter>

<filter name="AMR" synopsis="AMR in name"
help="A filter that matches AMR somewhere in the short message.">Message contains "AMR"</filter>

<filter name="AMR_CBA" extends="AMR" synopsis="AMR for CBA* devices"
help="A filter that matches AMR somewhere in the short message and CBA somewhere in the device
model.">Message contains "CBA"</filter>

<filter name="AMR_MOS" synopsis="AMR for *MOS* devices"
help="A filter that matches AMR somewhere in the short message and *MOS* somewhere in the device
model.">Message contains "AMR" and Message contains "MOS"</filter>

<filter name="MOV_MOS" synopsis="MOV for *MOS* devices"
help="A filter that matches MOV somewhere in the short message and *MOS* somewhere in the device
model.">Message contains "MOV" and Message contains "MOS"</filter>

<filter name="accumcomplex" synopsis="A filter with multiple clauses"
help="Checks for long accumulated durations/percentages and specific instance or assertion
names">(Instance matches "top*I32" and CumulativePercentageDuration > 99) or (AssertInst
contains "soa2" and CumulativeDuration > 4e-08)</filter>

</filters>
```

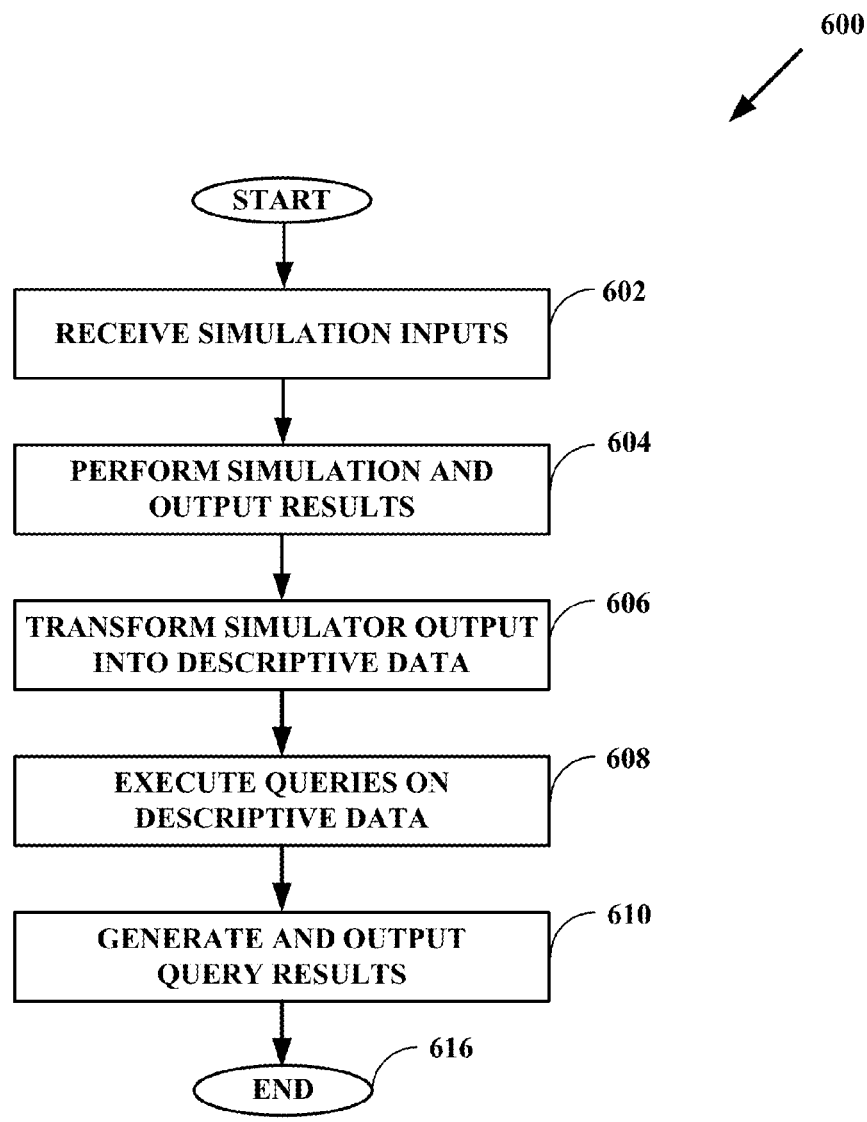

SYSTEM AND METHOD FOR DATA MINING SAFE OPERATING AREA VIOLATIONS

FIELD OF THE INVENTION

This description relates to the field of circuit simulation, and more specifically to management of safe operating area assertion violations and related simulation output.

BACKGROUND

Verification is an important step in the process of designing and creating an electronic product. Verification helps ensure that the electronic design will work for its intended purpose, and is usually performed at several stages of the electronic design process. Circuit designers and verification engineers use different methods and analysis tools to verify circuit designs, including simulation. Simulation verifies a design by monitoring computed behaviors of the design with respect to test stimuli. A variety of commercially offered software programs are available for circuit simulation.

Circuit performance measurements may be undertaken by a simulator or a post-simulation engine that evaluates stored simulated circuit waveforms. Simulator output is often saved in binary and text form for such analysis. Circuit operations may be verified during simulation by evaluating assertions, which are statements that are intended to always be true during correct circuit behavior. Assertions are commonly used to monitor the simulated operating conditions of individual semiconductor devices or other circuit components. Violations of such assertions may for example indicate that the monitored device has been exposed to conditions during simulation that exceed its maximum safe ratings.

Analysis of so-called "safe operating area" (SOA) assertions is therefore a required step in a circuit design flow. To validate the circuit design, designers must verify that devices do not encounter dangerous operating conditions that may result in reliability issues and product failures. As technologies advance, more numerous and complex SOA checks have been implemented, often as assertions, so that simulating even a relatively small circuit block may produce hundreds of assertion violations.

However, not all of these SOA violations are related to a really dangerous situation. Some assertions may just trigger routine warning messages, while others may denote more serious risk to the circuit depending on the cumulative duration of the violations. For example, many devices may safely sustain a relatively high voltage for a very short time, but not for longer times.

Designers must therefore expend considerable effort to investigate all of the assertion violations to locate and act on the more serious ones. This requirement leads to several negative consequences, including increased design time, and an increased chance of error. Some errors may result in an overdesign scenario (if a "false alarm" is mistaken for a real issue), while others may result in a product failure (if a serious violation is ignored). The circuit design community therefore needs a tool that enables designers to filter assertion violation messages, to easily determine which assertion violations are really dangerous.

Accordingly, the inventors have developed a novel way to help circuit designers manage SOA assertion violations and related simulation output.

BRIEF DESCRIPTION OF THE DRAWINGS

FIG. 5 is a filter file definition listing, according to an embodiment.

FIG. 6 is a flowchart of a SOA assertion violation management method, according to an embodiment.

DETAILED DESCRIPTION

This description presents an easy to use system, method, and computer program product for managing SOA assertion violations. Embodiments may transform simulator output into descriptive data in a form that may be stored in and processed by a database. The database may then execute queries on the descriptive data regarding SOA assertion violations. User input via command line arguments or GUI-based instructions may specify the particular descriptive data and/or assertion violations of interest. Embodiments may then generate query results and output them, for example in a text report and/or a spreadsheet-compatible report for further action by a circuit designer.

Simulation programs typically output numerical simulation results that may be stored in a binary file, and SOA assertion violation messages that may be stored in a text file. In one embodiment, the simulator itself may transform its regular output into a database-compatible form. In one mode, individual assertion violations may be explored directly, and in another mode assertion violations that accumulate over time and may thus be more serious may also be explored.

Embodiments provide a search language for specifying rules for selecting particular SOA assertion violations from the descriptive data in the database, for example by choosing a pre-existing filter and/or by defining a new filter. Filters may inherit rules from other filters and combine them with logical and comparative operators, enabling easy construction of complex selection expressions. Filters may therefore be tailored to provide the most useful information to a circuit designer, such as a particular level in a design hierarchy where the selected SOA assertion violations occurred. Filters may also specify cumulative assertion violation durations, cumulative assertion violation time percentages, voltage margins, current margins, power margins, text in a model, or text in a message.

Figure 1:
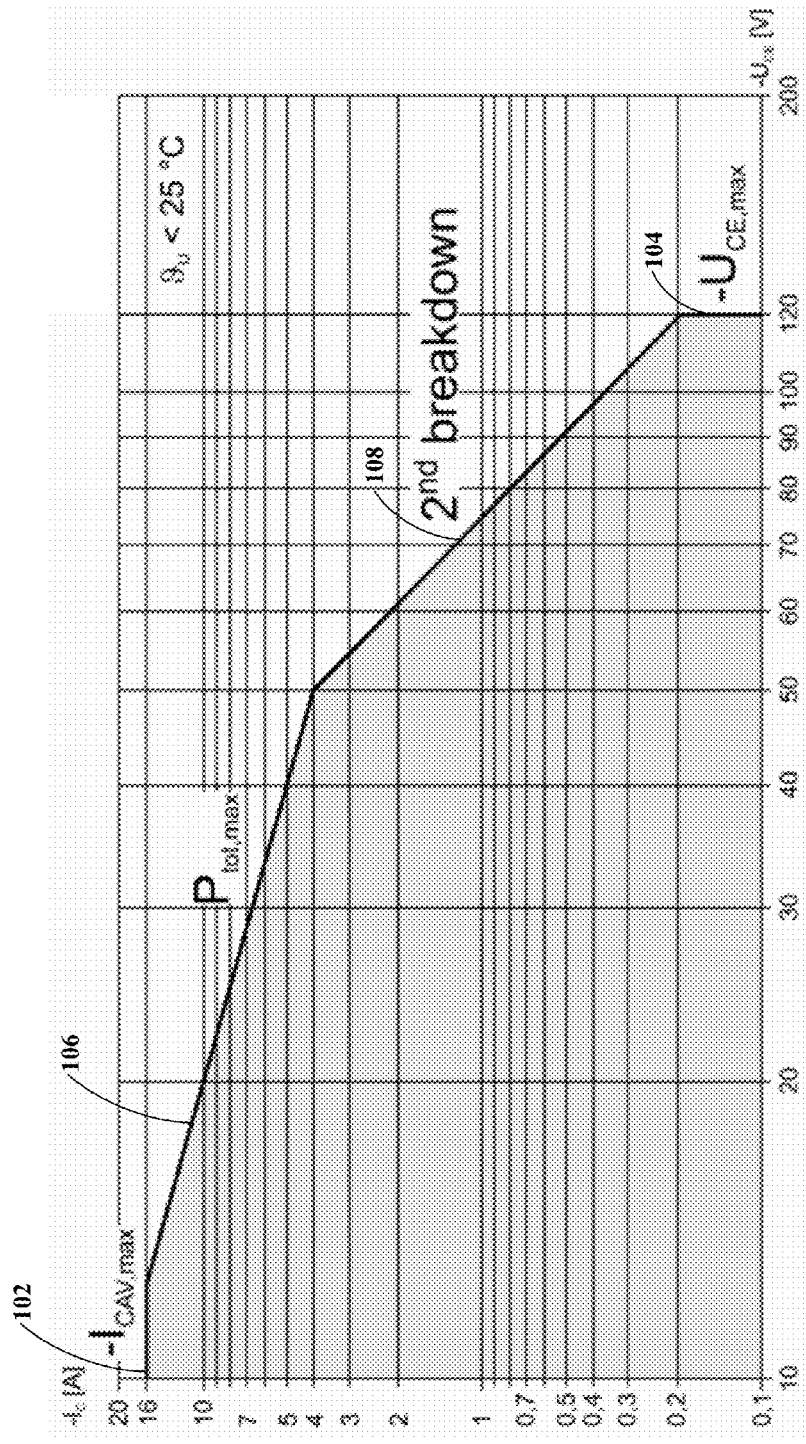
FIG. 1 is a diagram of the SOA of a bipolar power transistor, according to an embodiment.

FIG. 1 is a diagram of the SOA 100 of a bipolar power transistor, according to an embodiment. For semiconductor devices and other electronic components, the SOA may be defined as the voltage and current conditions over which a device may be expected to operate without suffering damage. The SOA specification may combine the various limitations of the device into one boundary curve, allowing simplified design of protection circuitry. Device limitations may include for example maximum voltage, current, power dissipation, junction temperature, and second breakdown related extremes.

The SOA is usually presented in transistor datasheets as a graph summarizing the safe "envelope". For bipolar transistors for example, it is common to present a graph such as that shown in FIG. 1, with $V_{CE}$ (collector-emitter voltage) on the abscissa and $I_{CE}$ (collector-emitter current) on the ordinate, and the SOA referring to the region under the curve.

In addition to the continuous ratings, separate SOA constraints and/or curves may be provided for short duration pulse conditions (e.g., one millisecond pulses, ten millisecond pulses, etc.). The SOA curve thus serves as a graphical representation of the power handling capability of the device under various conditions.

Where both current and voltage are plotted on logarithmic scales, the borders of the SOA are generally straight lines:
$I_C=I_{Cmax}$—current limit 102
$V_{CE}=V_{CEmax}$—voltage limit 104
$I_C*V_{CE}=P_{max}$—dissipation limit 106, beyond which thermal runaway may occur
$I_C*V_{CE}^\alpha$=constant—this is the limit 108 resulting from the so-called second breakdown phenomenon, a failure mechanism in bipolar junction transistors Transistors also require some time to turn off, due to effects such as minority carrier storage time and capacitance. They may be damaged while turning off, depending on how the connected load responds. The reverse bias safe operating area (RBSOA) is the SOA during the brief time before the device turns off. For some transistors, as long as the applied voltages and currents stay within the RBSOA during the entire turnoff time, the transistor may remain undamaged. The RBSOA may be specified for a variety of turn-off conditions, and may involve more complex constraints for some device types.

SOA specifications have traditionally been most useful for high-power circuits such as amplifiers and power supplies, as they allow for quick assessment of the limits of device performance, the design of appropriate protection circuitry, or selection of a more capable device. However, as modern integrated circuitry relies increasingly on smaller and more exotic devices with more limited and complicated power, voltage, and current constraints, SOA management is becoming increasingly relevant.

Figure 2:
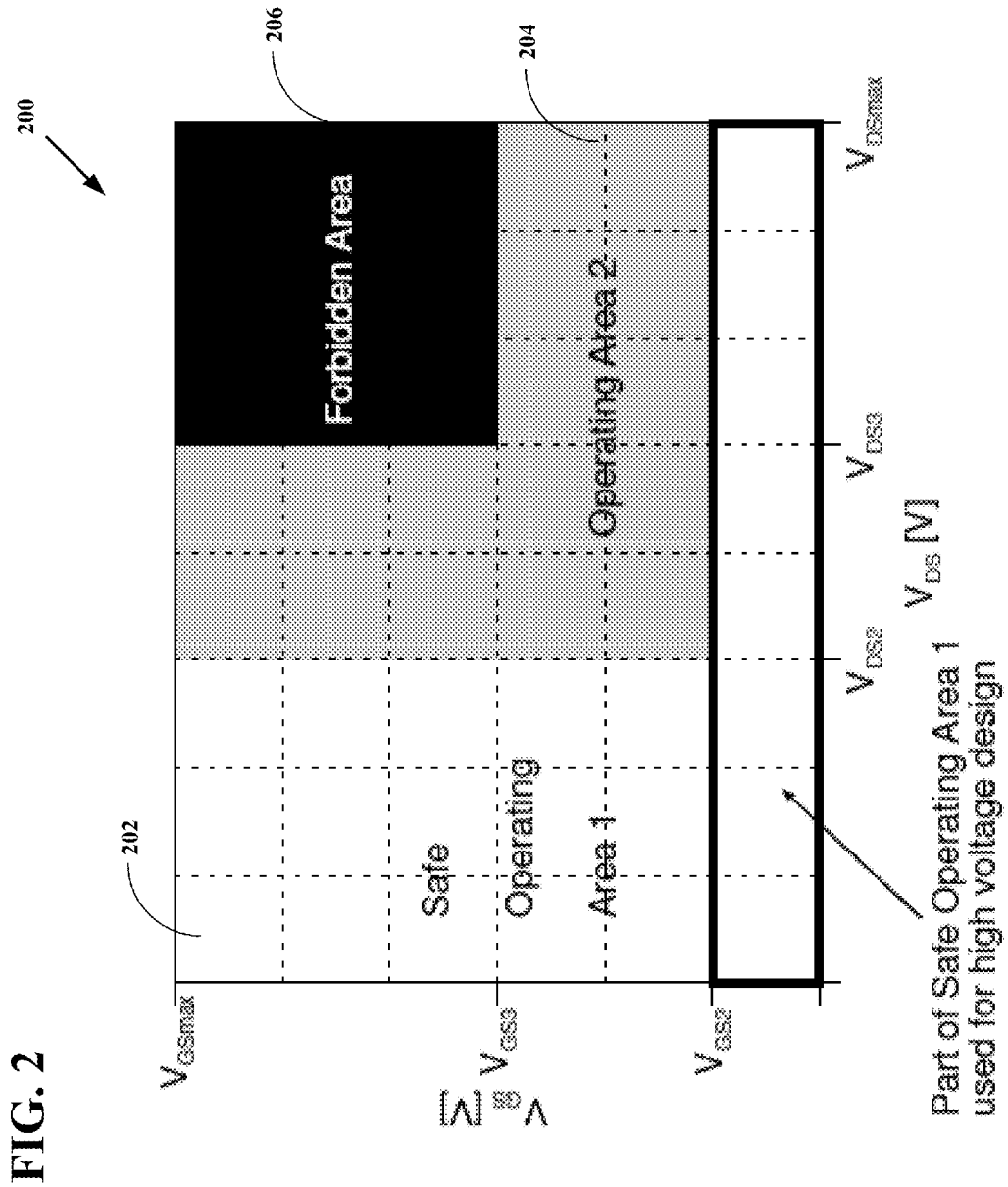
FIG. 2 is a diagram of the SOA of a MOSFET, according to an embodiment.

FIG. 2 is a diagram of the SOA 200 of a MOSFET, according to an embodiment. The normal operating area 202 is denoted as SOA one in this diagram, but brief excursions from this area may be acceptable. For example, the MOSFET may operate within shaded operating area two 204 for relatively short periods, but it can never be allowed to operate within the forbidden area 206 shown here in black.

Power MOSFETs do not exhibit secondary breakdown, and their SOA is usually limited only by maximum current (the capacity of the bonding wires), maximum power dissipation, and maximum voltage. However, power MOSFETs have parasitic PN and BJT elements within their structure, which may cause more complex localized failure modes resembling secondary breakdown. Device designers must consider all of the relevant physical behaviors when specifying their SOAs.

Integrated circuit manufacturers are increasingly providing process design kits (PDKs) including a library of SOA assertions to circuit designers. These PDKs provide not only the device models needed by designers for simulation, but also checks or assertions to help verify the devices are not dangerously overdriven in a simulated design. The increasing need for adherence to standards such as the ISO 26262 Automotive Safety Standard is partly driving this effort.

One example maximum operating voltage (MOV) assertion violation from a PDK file is as follows:
soa_1 assert sub=MOS_ABC expr=(v(g)-v(s))
+min=-1.66 max=1.66 duration=225 ps
+message="MOS_ABC-MOV violation"
+level=warning This message denotes that a specified maximum gate-source operating voltage range of (-1.66, 1.66) was exceeded for a MOSFET of type MOS_ABC for at least 225 picoseconds.

Current fabrication process PDKs may have over a dozen unique assertions for a single transistor device, for checking the various SOA constituent elements or constraints. Further, as circuit size and complexity increases, the assertion violations that may be produced during a circuit simulation may number in the hundreds of thousands. Not all of these violations should be considered as serious or fatal errors however, and indeed many may be ignored or waived under certain conditions.

However, the sheer number of violations produced makes it extremely difficult to distinguish the real issues from the spurious issues. Customers who use PDKs produced by a manufacturer may face these difficulties for a number of different designs. In the existing art, assertion violations encountered during circuit simulation are typically reported in a distributed manner, with textual error information routed to the simulator's logfile and numerical/timing information routed to the simulator's binary database. This arrangement complicates the designer's job of making sense of the various SOA violations.

Figure 3:
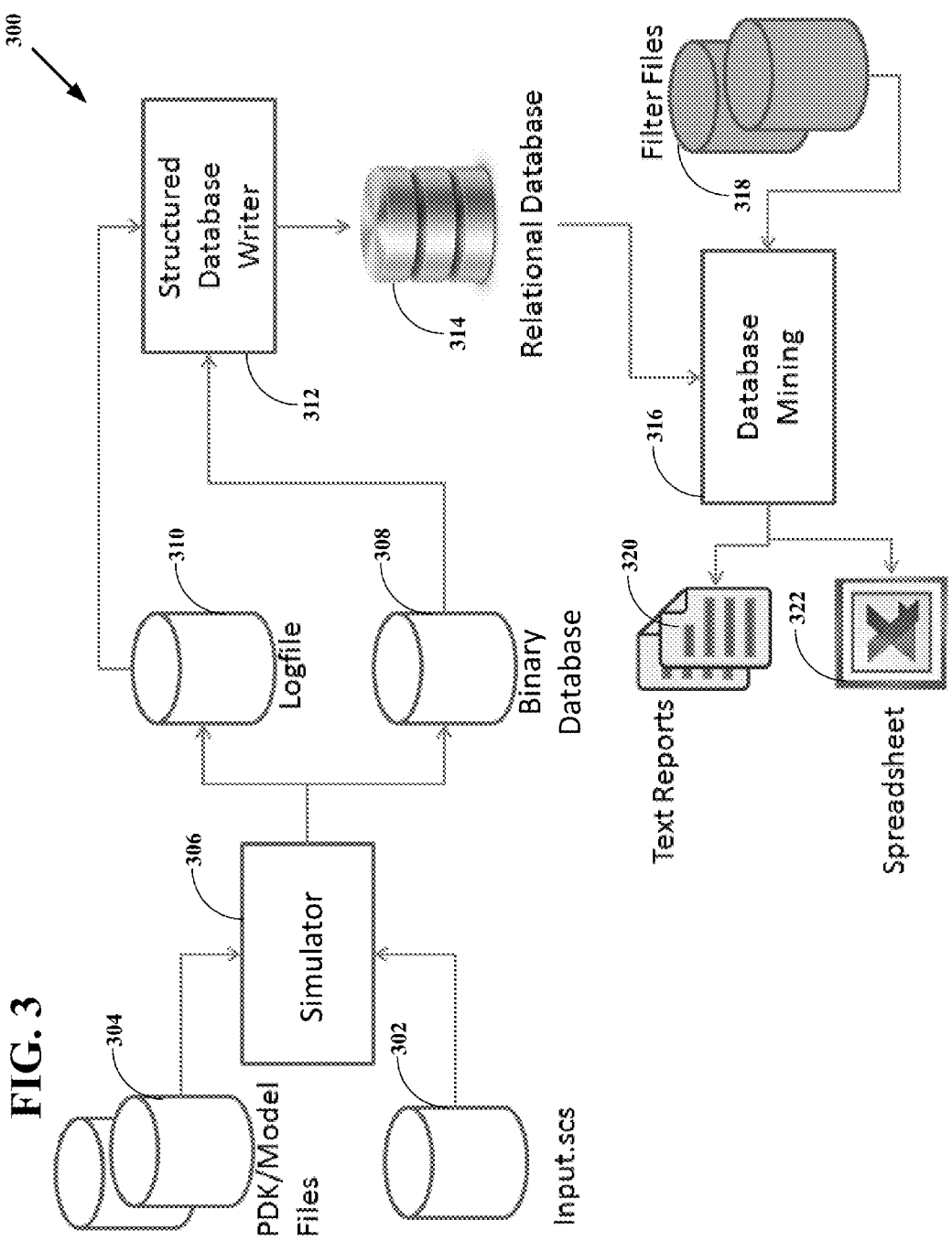
FIG. 3 is a diagram of a SOA assertion violation management system, according to an embodiment.

FIG. 3 is a diagram of a SOA assertion violation management system 300, according to an embodiment. In the embodiment shown in FIG. 3, a pair of scripts may be provided for converting an exemplary commercially available simulator's SOA assertion violation outputs into descriptive data more amenable to further processing for eventual designer review. A first script may transform the simulator output stored in the two primary sources (the simulator's binary-format output and the simulator's textual format output) into descriptive data for a single structured (e.g., relational) database. A second script may efficiently control the process of querying or "data mining" the descriptive data in the database, including filtering and sorting the violations according to user input. In one embodiment, the scripts are written in the Python language, but that implementation is merely exemplary and not limiting.

An input file 302 may represent a circuit design to be simulated, which may contain a netlist derived from a circuit schematic and/or layout for example. PDK/model files 304 describe the characteristics of individual devices that may be incorporated into a circuit design. Simulator 306 may comprise a SPICE-type commercial simulator for performing analog or mixed-signal circuit simulations, though such an implementation is exemplary and not limiting.

The simulator's binary-output database 308 may store simulation results including the numerical aspects of each assertion violation, such as the excessive voltage a particular device is experiencing as in the example SOA assertion previously described. The simulator's logfile 310 may store text-based error messages describing the various violations. Tables for the descriptive data may be created by the first script (structured database writer 312) in the relational database 314, with schema that may be queried with a support tool (not shown).

The relational database tables may be carefully normalized to keep the database size small. In one example, the size of the final relational database was found to be four times smaller than that of the binary format simulator database alone, even with the addition of the detailed error messages from the simulator logfile included (these error messages were not originally in the binary format database). The second, database mining script 316 may read a number of filter files 318, and allows additional command line arguments to be specified to provide additional filtering and sorting capabilities. In other embodiments, GUI-based user input may also be supported.

The database mining script 316 may also be configured to filter out database rows, that is, remove rows (assertion violations) that are not considered "interesting" to a designer. Any number of named filters from any number of named filter files may be applied, and custom filter expressions may also be applied. The filter files may be provided in a PDK or written by users themselves. A filtering language (to be described) allows for complex filters to be built up using logical (AND/OR) clauses. An additional layer of filtering may provide the ability to screen assertion violations according to the hierarchical location of the offending device within the design.

The database mining script 316 may dynamically construct the appropriate SQL queries from the various command line arguments and filter file 318 contents provided as input. The database mining script 316 may interact with relational database 314 to execute the SQL queries. The database mining script 316 may produce text reports 320 and spreadsheet-formatted outputs 322 as desired. For example, outputs 322 may comprise commercial spreadsheet compatible comma-separated values (CSV) format files.

Figure 4:
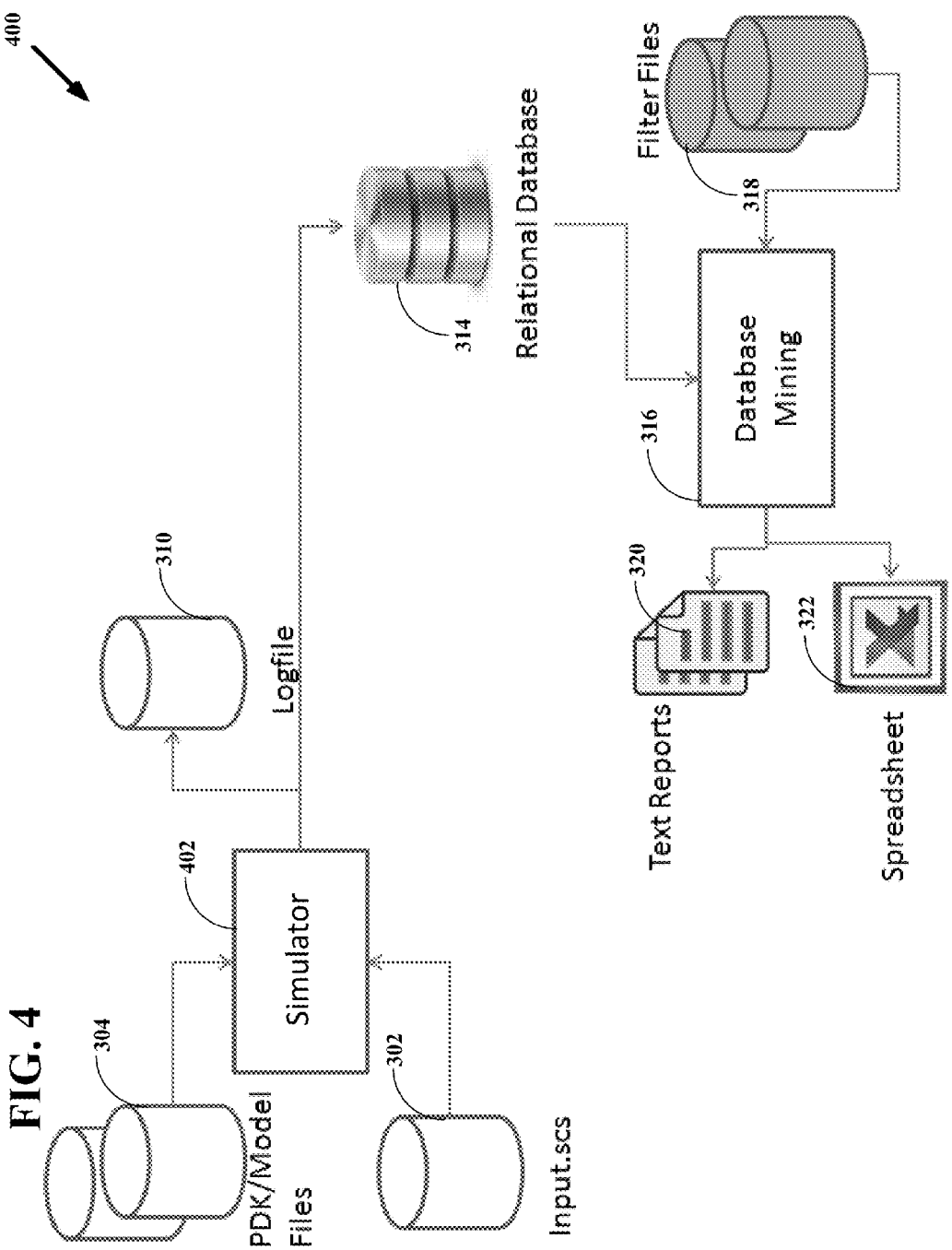
FIG. 4 is a diagram of a single-script SOA assertion violation management system, according to an embodiment.

FIG. 4 is a diagram of a single-script SOA assertion violation management system 400, according to an embodiment. In the FIG. 4 embodiment, the simulator 402 may be modified to directly output descriptive data for the relational database 314 using the same database schema. In such implementation, the structural database writer 312 of the previous embodiment is effectively moved into the previous embodiment's simulator 306. The descriptive data in the relational database 314 may be processed by a single database mining script 316 as previously described.

In another embodiment, a graphical user interface (GUI, not shown) may be provided to complement the command line, allowing designers to operate the system in a more intuitive manner. This GUI may allow the filter files 318 to be read and/or edited more easily, may invoke the script(s) 312/316 as necessary, and may present the results in a table widget (not shown). The database mining script 316 produces tabular output, and may be configured to present all table columns or only a subset of table columns. The output reports may be sorted in ascending or descending order of one or more columns.

FIG. 5 is a filter file definition listing 500, according to an embodiment. The filters allow for the creation of complex filter expressions for selecting assertion violations of interest. In the filter expressions, UNIX glob-like pattern-matching wildcards (such as "*" and "?") may be supported for filtering string-valued columns. Standard numerical Boolean operators ("<", "<=", "=", ">", ">=") may be supported for filtering numeric fields. Filter clauses may be grouped using parentheses, and any number of AND/OR expressions may be supported.

In addition, some special pattern matching operators may be provided as part of a filter expression language for matching string columns values. These may include the following:
contains—used to specify that a string contains a substring. Example: Message contains "MOV"
startswith—used to specify that a string starts with a substring. Example: Instance startswith "top.iI"
endswith—used to specify that a string ends with a substring. Example: Message endswith "AMR violation"
matches—used to specify that a string matches a UNIX glob expression. Example: Message matches "*MOV*"

Users often reference previously written filters, which may be supplied in a read-only file format by an in-house PDK team for example, in addition to their own filters. In one embodiment therefore, a novel scheme is provided that allows filters to be defined such that they inherit from other filters, including the ability for user-created filters to inherit from the typically read-only PDK filters. In one embodiment, filter files may be constructed using XML syntax; other syntaxes such as that of JSON or other known languages could also be used in other exemplary and non-limiting implementations.

The main structure of the FIG. 5 XML file is a <filters> root element, which may internally contain one or more <filter> elements. Each <filter> element in turn may provide up to four attributes in this embodiment, and its textual value may provide the actual filter expression itself. The attributes of this implementation and their corresponding purposes are as follows:
name—a short identifier/name for the filter
synopsis—a short synopsis/summary of what the filter does
help—a longer description providing as much detail as necessary for what the filter does
extends—(optional attribute) allows for filter inheritance, so a first filter may be extended by a second filter.

Note that the textual value of the filter (that is, the value between the <filter> and </filter> tags) may provide the actual filter expression itself using a simple filter expression language. The "MOV" filter (the first one in the FIG. 5 listing) contains a short filter expression:
Message contains "MOV"

Here, the "Message" field in the expression corresponds to an assertion definition itself, as in the soa_1 SOA assertion example listed previously. When applied using the database mining script, the "MOV" (maximum operating voltage) filter may therefore filter the violations to select only those violations whose corresponding assertion definitions themselves contain the term "MOV" as a substring within their Message field.

The "accumcomplex" check (near the bottom of the FIG. 5 listing) provides a more complex filtering example. When applied, it will filter the violations to select only those where the violating device instances match a particular expression. In this case either the instance of the transistor device undergoing the violation must match the pattern "top*I32" and the Cumulative Percentage Violation time for this device exceeds 99% of the total transient simulation interval, or the instantiated assertion check definition itself contains the substring "soa2" in the definition's own unique instance name, and the accumulated violation time for the device (summed over all that device's individual violations) exceeds forty nanoseconds.

The "AMR_CBA" filter inherits the filter expression of the "AMR" (absolute maximum rating) filter, in addition to providing its own filter expression: Message contains "CBA". In an embodiment, both filter expressions may be effectively joined via an AND clause so the "AMR_CBA" filter may be considered "narrower" in scope than the "AMR" filter. The effective filter expression for the "AMR_CBA" filter is therefore as follows:
((Message contains "AMR") AND (Message contains "CBA")).

In another embodiment, both filter expressions may be effectively joined via an OR clause so the "AMR_CBA" filter may be considered "broader" in scope than the "AMR" filter. The effective filter expression for the "AMR_CBA" filter is therefore as follows:
((Message contains "AMR") OR (Message contains "CBA").

In another embodiment, a command line switch to the database mining script 316 may allow the user to determine whether filter inheritance is AND-based or OR-based.

Note that the named filter referenced in the "extends" attribute does not have to exist in the same file as the filter that is performing the reference. This feature supports a situation where some first set of filters may be provided by a PDK team in a first set of filter files, which may then be further extended (that is, narrowed or broadened in scope) by user-defined filters defined in a second set of filter files.

Embodiments enable two major use modes for managing SOA assertion violations. In the first use mode, assertion violations may be inspected independently from each other, even for the same device. In the second "accumulated" use mode, the individual assertion violation times may be accumulated over the duration of the simulation, and expressed in table columns as both raw and accumulated values. The accumulated values may also be expressed as a percentage of the overall simulation time.

Queries and table sorts may for example show only those violations that exceed a specified percentage of the total simulation time. Circuit designers may display the accumulated violations sorted in decreasing order of accumulated percentage violation time. In this way, those devices with the largest violation time percentages (which are likely to be considered the most egregious "offenders" in a design) may be listed first.

Options for controlling the two major use modes may be provided via command line arguments or by graphical user interface tools. The results may for example be presented in tabular form, with relevant output fields and values that may be chosen for display and reordered. For the individual violation mode, a user may specify instructions to list violations in terms of individual violations, so that the accumulated durations and device durations may not be listed. Alternately, for the accumulated violation mode, a user may specify instructions to list violations in terms of accumulated durations and device durations, so that the individual violation details may not be listed.

The following additional non-limiting examples describe the potential uses of the individual violation mode or the accumulated violation mode that may be specified:

List All the Individual Violations, with no filtering applied

List Violations with Accumulated Durations (for transient simulations)

List Available Filters (e.g., show "MOV" occurrences in filters)

Apply Pre-written Filters (e.g., apply filters single or multiple times, with AND or OR combination control specified)

List Individual Violations, with filtering applied (e.g., show limited number of violations)

Filter Individual Violations (e.g., select only the first n "MOV" violations)

Sort Violations (e.g., sort by cumulative violation duration time)

Sort Violations by Over Voltage Margin (e.g., sort by the amount by which an expression value exceeds its upper or lower bound)

Combined Sort and Filter, with a custom filter expression (e.g., to specify an expression not pre-defined in any filter file, such as violations occurring within a given time frame)

Additional Filtering based on Design Hierarchy (e.g., select violations from a given level in a hierarchical design)

Export a CSV File (or other commercial spreadsheet-compliant file format, e.g., with a particular specified filename and selected columns or number of devices etc.)

Further exemplary but non-limiting selection of violations for various design purposes is also supported. For example, violations where the cumulative percentage violation is greater than a filter-specified value may be selected for output. Output column widths may be specified, and a maximum number of violating devices to be included may also be specified. The combination of filters defined via AND and OR operations may also be specified. The number of violations encountered to be displayed may also be specified.

FIG. 6 is a flowchart of a SOA assertion violation management method 600, according to an embodiment. At 602, a user may provide simulation inputs such as component models (which may be from a PDK) and netlists for example to a computer-executable simulator program. At 604, the simulator program may perform the simulation according to the user input, and output its results. The simulator program may output textual results and binary-format results; the results may comprise numerical data describing circuit behavior, and also SOA assertion violation messages.

At 606, a first script may transform the simulator output into descriptive data that is compatible with a database, according to user input. In one embodiment, the simulator program may perform the transformation itself and output database-compatible descriptive data.

At 608, a second script may execute queries with the database on the descriptive data describing the SOA assertion violations according to user input. The user input may comprise command-line arguments and/or GUI-based instructions. The user input may also comprise at least one filter, which may be defined by the user or selected from a number of pre-defined filters, to specify rules for selecting SOA assertion violations. A filter expression language may be used to this end.

In one embodiment, one or more filters may inherit rules from at least one other filter. Filters may also be combined via logical AND or alternatively logical OR comparative operators to create complex filter expressions. A filter may specify at least one level in a design hierarchy where selected SOA assertion violations occurred. A filter may specify text in a model name or type, text in an assertion definition message, a power margin, a voltage margin, a current margin, a cumulative assertion violation duration, and/or a cumulative assertion violation time percentage for example.

At 610, the database may generate query results for output in a tangible form. The query results may be outputted in for example a text report and/or a spreadsheet-compatible report such as a CSV-format file. The query results may be sorted and viewed as desired by a user to provide clearer intuition regarding a circuit design being analyzed.

To summarize, embodiments organize SOA assertion violations to make them more amenable to filtering by designers, and present novel methods for creating and using filters for selecting violations of interest. Filters may inherit selection rules from previously created filters, such as those typically read-only filters supplied with a PDK. Since hundreds of thousands of violations may be produced for realistically sized circuits, a relational database solution is designed to scale, allowing such large numbers of assertion violations to be sorted and filtered extremely efficiently and rapidly (in mere seconds). In addition, a special filtering language is provided to facilitate the creation of complex filters.

Figure 7:
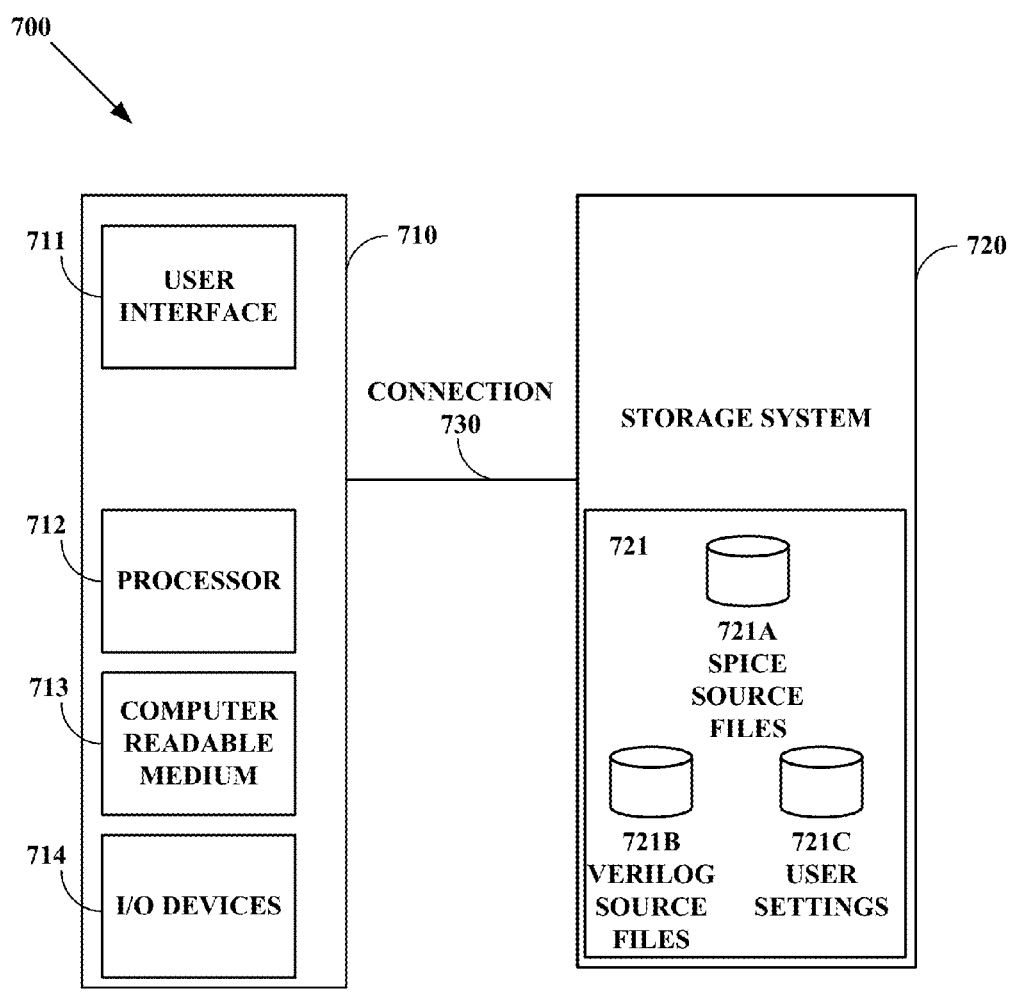
FIG. 7 is a block diagram of a circuit analysis system, according to an embodiment.

FIG. 7 is a block diagram of an exemplary circuit analysis system 700, according to an embodiment. This system may provide simulator functionality for any of the methods described above. A user may access the system 700 through a standalone client system, client-server environment, or a network environment. System 700 may comprise one or more clients or servers 710, one or more storage systems 720, and a connection or connections 730 between and among these elements.

Client 710 may execute instructions stored on transitory or non-transitory computer readable medium 713 with processor 712, and may provide a user interface 711 to allow a user to access storage system 720. The instructions may be part of a software program or executable file that may operate electronic design automation (EDA) software. Client 710 may be any computing system, such as a personal computer, workstation, mobile computer, or other device employing a processor which is able to execute programming instructions. User interface 711 may be a GUI run in a user-controlled application window on a display. A user may interact with user interface 711 through one or more input/output (I/O) devices 714 such as a keyboard, a mouse, or a touch screen.

Storage system 720 may take any number of forms, including but not limited to a server with one or more storage devices attached to it, a storage area network, or one or a plurality of non-transitory computer readable media. Databases 721 may be stored in storage system 720 such that they may be persistent, retrieved, or edited by the user. Databases 721 may include SPICE source files 721A, Verilog source files 721B, and a user input database 721C for example. These databases may be kept as separate files or systems, or may be merged together in any appropriate combination.

Only one client 710 is shown connected to storage system 720 through connection 730, which may be a simple direct wired or wireless connection, a system bus, a network connection, or the like, to provide client 710 with access to storage system 720. In another aspect, connection 730 may enable multiple clients 710 to connect to storage system 720. The connection may be part of a local area network, a wide area network, or another type of network, again providing one or more clients with access to storage system 720. Depending on system administrator settings, client 710's access to system storage 720 or to other clients may be limited.

Figure 8:
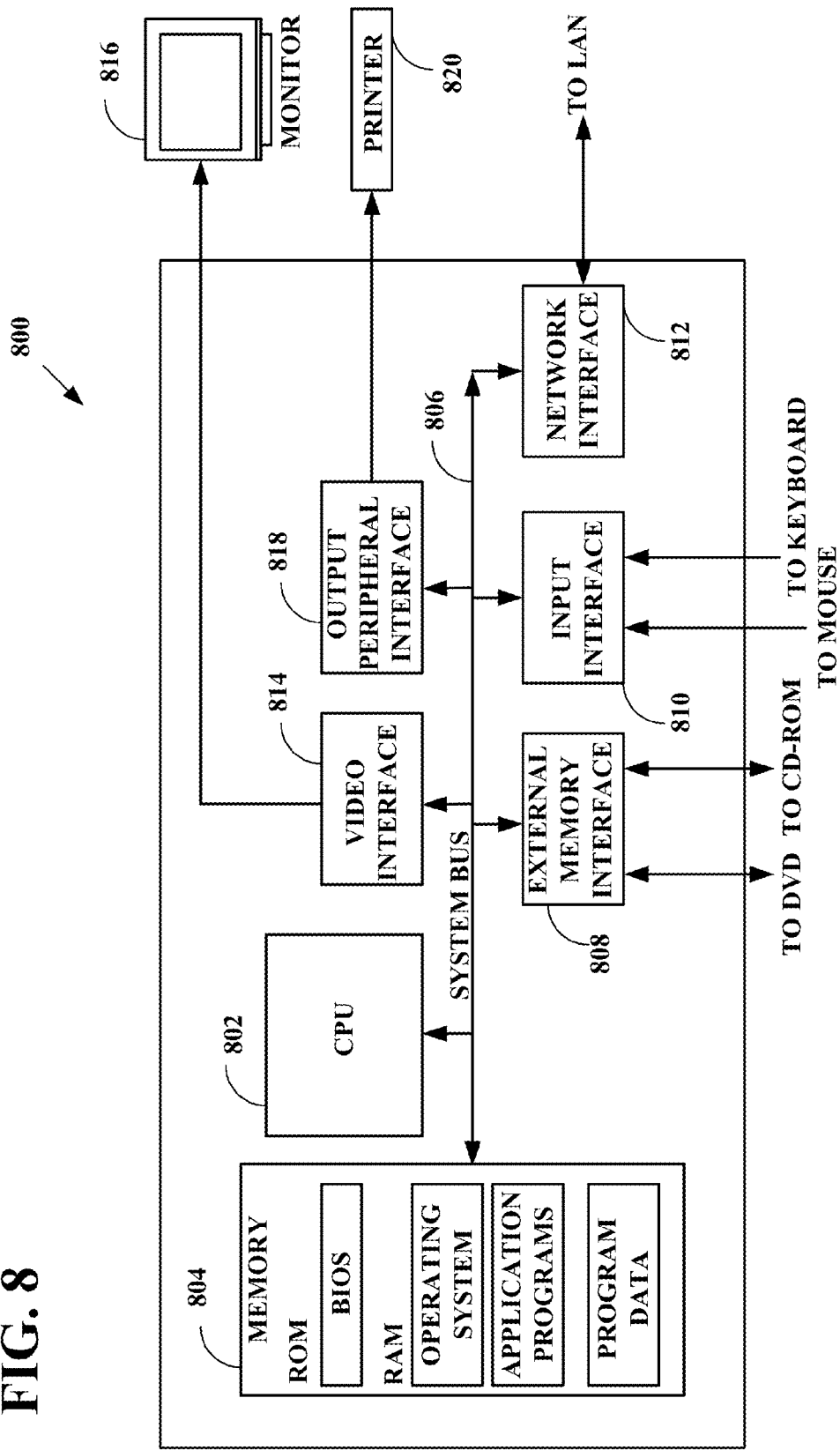
FIG. 8 is a diagram of a computer system, according to an embodiment.

FIG. 8 depicts an exemplary computer system comprising the structure for implementation of the embodiments described above. Computer system 800 comprises a central processing unit (CPU) 802 that processes data stored in memory 804 exchanged via system bus 806. Memory 804 typically includes read-only memory, such as a built-in operating system, and random-access memory, which may include an operating system, application programs, and program data. Computer system 800 also comprises an external memory interface 808 to exchange data with a DVD or CD-ROM for example. Further, input interface 810 may serve to receive input from user input devices including but not limited to a keyboard and a mouse. Network interface 812 may allow external data exchange with a local area network (LAN) or other network, including the internet. Computer system 800 also typically comprises a video interface 814 for displaying information to a user via a monitor 816. An output peripheral interface 818 may output computational results and other information to output devices including but not limited to a printer 820.

Computer system 800 may comprise for example a personal computer or an engineering workstation, each of which is widely known in the art and is commonly used for integrated circuit design tasks, along with software products commercially available for performing computer-aided integrated circuit design tasks. Computer system 800 may also comprise a mobile computer, including for example a tablet computer or a smart phone. The computer system of FIG. 8 may for example receive program instructions, whether from existing software products or from embodiments of the present invention, via a computer program product and/or a network link to an external site.

For purposes of explanation, specific nomenclature is set forth to provide a thorough understanding of the present invention. Description of specific applications and methods are provided only as examples. Various modifications to the embodiments will be readily apparent to those skilled in the art and the general principles defined herein may be applied to other embodiments and applications without departing from the spirit and scope of the invention. Thus the present invention is not intended to be limited to the embodiments shown, but is to be accorded the widest scope consistent with the principles and steps disclosed herein.

As used herein, the terms "a" or "an" shall mean one or more than one. The term "plurality" shall mean two or more than two. The term "another" is defined as a second or more. The terms "including" and/or "having" are open ended (e.g., comprising). Reference throughout this document to "one embodiment", "certain embodiments", "an embodiment" or similar term means that a particular feature, structure, or characteristic described in connection with the embodiment is included in at least one embodiment. Thus, the appearances of such phrases in various places throughout this specification are not necessarily all referring to the same embodiment. Furthermore, the particular features, structures, or characteristics may be combined in any suitable manner on one or more embodiments without limitation. The term "or" as used herein is to be interpreted as inclusive or meaning any one or any combination. Therefore, "A, B or C" means "any of the following: A; B; C; A and B; A and C; B and C; A, B and C". An exception to this definition will occur only when a combination of elements, functions, steps or acts are in some way inherently mutually exclusive.

In accordance with the practices of persons skilled in the art of computer programming, embodiments are described with reference to operations that may be performed by a computer system or a like electronic system. Such operations are sometimes referred to as being computer-executed. It will be appreciated that operations that are symbolically represented include the manipulation by a processor, such as a central processing unit, of electrical signals representing data bits and the maintenance of data bits at memory locations, such as in system memory, as well as other processing of signals. The memory locations where data bits are maintained are physical locations that have particular electrical, magnetic, optical, or organic properties corresponding to the data bits.

When implemented in software, the elements of the embodiments may serve as the code segments directing a computing device to perform the necessary tasks. The non-transitory code segments may be stored in a processor readable medium or computer readable medium, which may include any medium that may store or transfer information. Examples of such media include an electronic circuit, a semiconductor memory device, a read-only memory (ROM), a flash memory or other non-volatile memory, a floppy diskette, a CD-ROM, an optical disk, a hard disk, a fiber optic medium, etc. User input may include any combination of a keyboard, mouse, touch screen, voice command input, etc. User input may similarly be used to direct a browser application executing on a user's computing device to one or more network resources, such as web pages, from which computing resources may be accessed.

While particular embodiments of the present invention have been described, it is to be understood that various different modifications within the scope and spirit of the invention are possible. The invention is limited only by the scope of the appended claims.

What is claimed is:

1. A processor-implemented method for increasing the reliability of a circuit design by managing safe operating area assertion violations, the method comprising:
   using a processor that reads and executes instructions from a non-transitory storage medium for:
      transforming simulator output into descriptive data, regarding safe operating area assertion violations, wherein the descriptive data is compatible with a database;
      executing queries with the database on the descriptive data regarding the safe operating area assertion violations according to user input; and
      generating tangible query results regarding the safe operating area assertion violations for the circuit design to work for its intended purpose.

2. The method of claim 1 wherein the simulator output comprises at least one of textual output and binary output.

3. The method of claim 1 wherein the simulator output comprises numerical simulation results and safe operating area assertion violation messages.

4. The method of claim 1 wherein a simulator program performs the transforming and produces the descriptive data.

5. The method of claim 1 wherein the user input comprises at least one of command line arguments and instructions provided via a graphical user interface.

6. The method of claim 1 wherein the user input comprises at least one of choosing and defining at least one filter that specifies rules for selecting particular safe operating area assertion violations.

7. The method of claim 6 wherein at least one filter inherits at least one rule from at least one other filter.

8. The method of claim 6 wherein the filter specifies at least one level in a design hierarchy where the selected safe operating area assertion violations occurred.

9. The method of claim 6 wherein the filter specifies at least one of a cumulative assertion violation duration, a cumulative assertion violation time percentage, a voltage margin, a current margin, a power margin, text in a model, and text in a message.

10. The method of claim 1 wherein the query results comprise at least one of a text report and a spreadsheet-compatible report.

11. A non-transitory computer readable medium storing instructions that, when executed by a processor, perform a method for increasing the reliability of a circuit design by managing safe operating area assertion violations, the processor-implemented method comprising:
   transforming simulator output into descriptive data, regarding safe operating area assertion violations, wherein the descriptive data is compatible with a database;
   executing queries with the database on the descriptive data regarding the safe operating area assertion violations according to user input; and
   generating tangible query results regarding the safe operating area assertion violations for the circuit design to work for its intended purpose.

12. The medium of claim 11 wherein the simulator output comprises at least one of textual output and binary output.

13. The medium of claim 11 wherein the simulator output comprises numerical simulation results and safe operating area assertion violation messages.

14. The medium of claim 11 wherein a simulator program performs the transforming and produces the descriptive data.

15. The medium of claim 11 wherein the user input comprises at least one of command line arguments and instructions provided via a graphical user interface.

16. The medium of claim 11 wherein the user input comprises at least one of choosing and defining at least one filter that specifies rules for selecting particular safe operating area assertion violations.

17. The medium of claim 16 wherein at least one filter inherits at least one rule from at least one other filter.

18. The medium of claim 16 wherein the filter specifies at least one level in a design hierarchy where the selected safe operating area assertion violations occurred.

19. The medium of claim 16 wherein the filter specifies at least one of a cumulative assertion violation duration, a cumulative assertion violation time percentage, a voltage margin, a current margin, a power margin, text in a model, and text in a message.

20. A system for increasing the reliability of a circuit design by managing safe operating area assertion violations, comprising:
   a non-transitory storage medium for storing executable instructions; and
   a processor executing the instructions to:
      transform simulator output into descriptive data, regarding safe operating area assertion violations, wherein the descriptive data is compatible with a database;
      execute queries with the database on the descriptive data regarding the safe operating area assertion violations according to user input; and
      generate tangible query results regarding the safe operating area assertion violations for the circuit design to work for its intended purpose.

* * * * *